United States Patent
Baek

(10) Patent No.: US 9,810,725 B2
(45) Date of Patent: Nov. 7, 2017

(54) METHOD AND DEVICE FOR CHARGING BATTERY

(75) Inventor: Seongmun Baek, Anyang-si (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/325,958

(22) Filed: Dec. 14, 2011

(65) Prior Publication Data

US 2012/0278215 A1   Nov. 1, 2012

Related U.S. Application Data

(63) Continuation of application No. PCT/KR2011/008267, filed on Nov. 2, 2011.

(30) Foreign Application Priority Data

Apr. 28, 2011 (KR) .................. 10-2011-0040339

(51) Int. Cl.
*G01R 22/10* (2006.01)
*H02J 7/00* (2006.01)
*B60L 11/18* (2006.01)
*G01R 22/06* (2006.01)

(52) U.S. Cl.
CPC .......... *G01R 22/10* (2013.01); *B60L 11/1846* (2013.01); *B60L 11/1848* (2013.01); *H02J 7/0004* (2013.01); *G01R 22/063* (2013.01); *Y02T 10/7005* (2013.01); *Y02T 10/7072* (2013.01); *Y02T 90/121* (2013.01); *Y02T 90/128* (2013.01); *Y02T 90/14* (2013.01); *Y02T 90/163* (2013.01); *Y02T 90/169* (2013.01); *Y04S 30/14* (2013.01)

(58) Field of Classification Search
CPC .............................. G06Q 30/04; G06Q 20/145
USPC .......................................................... 705/34
See application file for complete search history.

(56) References Cited

U.S. PATENT DOCUMENTS

| 2002/0158749 A1* | 10/2002 | Ikeda et al. .................. 340/5.74 |
| 2010/0049639 A1* | 2/2010 | Ferro et al. ..................... 705/34 |
| 2010/0207588 A1* | 8/2010 | Lowenthal .......... B60L 11/1816 320/165 |

FOREIGN PATENT DOCUMENTS

| JP | 2009-129384 A | 6/2009 |
| JP | 2010-92232 A | 4/2010 |
| KR | 10-2009-0125560 A | 12/2009 |

(Continued)

OTHER PUBLICATIONS

Almedia, Pedro Miguel Pousada da Rocha. Impact of vehicle to grid in the power system dynamic behaviour. Universidade do Porto (Portugal), ProQuest Dissertations Publishing, 2011.*

(Continued)

*Primary Examiner* — Florian Zeender
*Assistant Examiner* — Fawaad Haider
(74) *Attorney, Agent, or Firm* — Birch, Stewart, Kolasch & Birch, LLP

(57) ABSTRACT

A method and device of charging a battery is provided. A charging device transmits a charging initiation request including a charging identifier for identifying a user to an electric meter and receives a charging initiation response from the electricity meter. The charging device performs charging by connecting the charging station with the battery after receiving the charging initiation response. The charging device receives charging information indicating billing information according to the charging of the battery from the electricity meter.

7 Claims, 4 Drawing Sheets

(56) References Cited

FOREIGN PATENT DOCUMENTS

KR        10-1014539 B1    2/2011
WO    WO 2010/031687 A1   3/2010
WO    WO 2010/034741 A1   4/2010

OTHER PUBLICATIONS

Korean Office Action dated Nov. 27, 2012.
Chinese Office Action for Application No. 201180070469.7 dated Apr. 23, 2015 with English translation.
Extended European Search Report dated Jan. 27, 2016 for Application No. 11864528.2.
Chinese Office Action, dated Dec. 11, 2015, for Chinese Application No. 201180070469.7, with an English translation.

* cited by examiner

METHOD AND DEVICE FOR CHARGING BATTERY

This application is a Continuation of PCT International Application No. PCT/KR2011/008267 filed on Nov. 2, 2011, which claims priority under 35 U.S.C. §119(a) to Patent Application No. 10-2011-0040339 filed in the Republic of Korea on Apr. 28, 2011, all of which are hereby expressly incorporated by reference into the present application.

TECHNICAL FIELD

The present invention relates to battery charging, and more specifically to a battery charging device and method for electric vehicles.

BACKGROUND

Electric vehicles have been developed that use electric energy as their operation sources in order to solve the problem of the increase in expense of fossil fuel and to conserve resources and promote recycling. Such electric vehicles wholly or partially adopt electrical power for operation.

An electric vehicle includes an electric storage mechanism, such as a battery. The electric storage mechanism needs to be electrically charged for continuous operation.

A charging station serves as a charging point for electric vehicles. The charging station may be located in a designated charging point similar to a gas station. Or, the charging station may be considered to be positioned in a public or private parking lot.

Korean Patent No. 10-1014539 titled "charging device and method for a plug-in hybrid electric vehicle" discloses a method of permitting charging an electric vehicle and performing billing for charging.

Korean Patent Application Publication No. 10-2009-0125560 titled "intelligent electricity charging control cabinet and system for charging an electric vehicle" discloses a charging control cabinet that can independently perform a billing process.

Conventionally a charging station provided at a predetermined location may perform all of the processes including authentication, charging, and billing. However, such a charging station calls for a new authentication system and billing system for electric vehicles.

Electric vehicles exhibit a relatively short travelling distance compared to existing vehicles even when fully charged. Although charging stations may be installed at a shorter interval than an interval at which existing gas stations are installed, this is inefficient in light of expense and use of lands.

DETAILED DESCRIPTION

Problems to be Solved by Invention

The present invention provides a charging method and device for charging a battery using communication with a charging station.

The present invention provides an electricity meter that measures electric power consumed by the charging station and communicates with the charging device.

Technical Solution

A method of charging a battery is provided. The method includes transmitting a charging initiation request to an electricity meter of a charging station to which electric power is supplied for charging the battery, the charging initiation request including a charging identifier for identifying a user, receiving a charging initiation response in response to the charging initiation request from the electricity meter, the charging initiation response including a meter identifier for identifying the electricity meter and the charging identifier, performing charging by connecting the charging station with the battery after receiving the charging initiation response, transmitting a charging completion message indicating that electric power has been provided for charging to the electricity meter upon completion of the charging, the charging completion message including the charging identifier and the meter identifier, and receiving charging information indicating billing information according to the charging of the battery from the electricity meter.

The method may further include performing authentication for the user and upon completion of the authentication, the charging initiation request may be transmitted.

In another aspect, a charging device for charging a battery includes a first connector electrically connected to the battery, a second connector electrically connected to a charging station to which electric power is supplied, and a control device connected to the first and second connectors and configured to communicate with an electricity meter using a charging identifier for identifying a user and a meter identifier for identifying the electricity meter for measuring electric power consumed by the charging station, and produce billing information according to the charging of the battery.

The control device may include a display for displaying the billing information, a power measuring unit for measuring electric power consumed for charging the battery, a memory for storing the charging identifier, a transceiver for communicating with the electricity meter, and a controller connected to the transceiver.

The controller is configured to transmit a charging initiation request including the charging identifier to the electricity meter, receive a charging initiation response including the charging identifier and the meter identifier in response to the charging initiation request from the electricity meter, perform charging by connecting the charging station to the battery after receiving the charging initiation response, transmit a charging completion message indicating that electric power has been provided for charging to the electricity meter upon completion of the charging, the charging completion message including the charging identifier and the meter identifier, and receive charging information indicating billing information according to the charging of the battery from the electricity meter.

In still another aspect, an electricity meter arranged in a charging station connected to a charging device for charging a battery is provided. The electricity meter includes a power measuring unit for measuring electric power consumed by the charging station, a memory for storing a meter identifier to identify the electricity meter, a transceiver for communicating with the charging device and a server; and a controller connected to the transceiver and for communicating with the charging device and the server using a charging identifier for identifying a user and the meter identifier.

Advantageous Effects

Without the need for a separate billing device or authentication device, a house or gas station in which an electricity meter is installed may be utilized as a charging station.

Since a plurality of points which a user may easily access may be utilized as charging stations, any inconveniences due to battery charging may be reduced thus increasing availability of the electric vehicles.

EMBODIMENTS

Electric vehicles refer to automobiles having one or more electric motors to obtain a driving force. Energy used for operating an electric vehicle may come from an electrical source, such as a battery and/or fuel cell that may be rechargeable. Electric vehicles include hybrid electric vehicles using a combustion engine as another driving power source.

Figure 1:
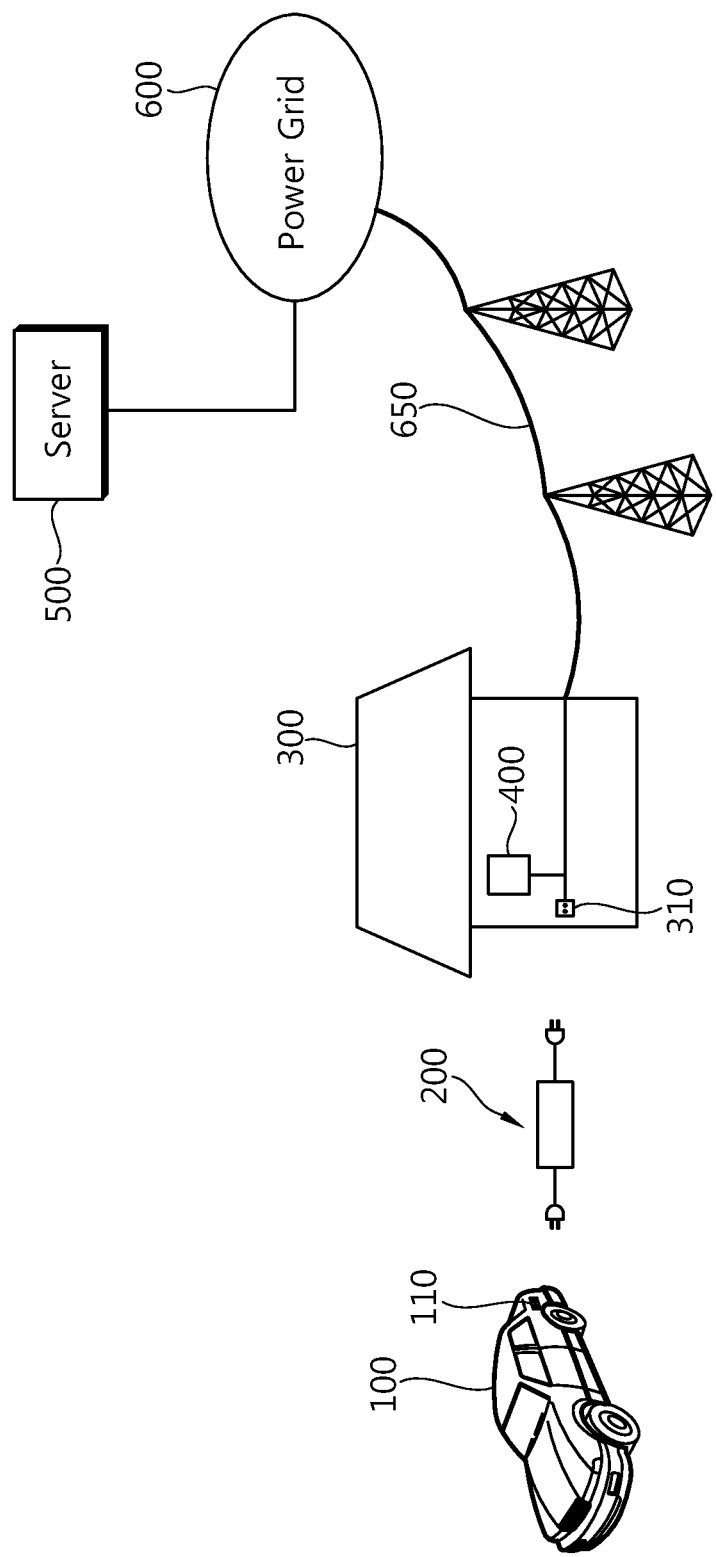
FIG. 1 is a view schematically illustrating a charging system according to an embodiment of the present invention.

FIG. 1 is a view schematically illustrating a charging system according to an embodiment of the present invention.

The charging system includes a vehicle 100, a charging device 200, a charging station 300, a server 500, and a power grid 600.

The charging station 300 is connected to the power grid 600 through a power line 650 and receives power from the power grid 600.

The power grid 600 includes one or more power generating facilities that generate electric power. The power grid 600 may include various power generating facilities, such as a thermoelectric power plant, a nuclear power plant, or a solar power plant.

The charging station 300 is also connected to the server 500. The charging station 300 may be connected to the server 500 through power line communication. Or, the charging station 300 may be connected to the server 500 through a well-known network, such as a wireless personal area network (WPAN) or local area network (LAN).

The server 500 generates billing information according to use of electric power.

The charging station 300 is a place, such as a residential house, which supplies electric power. The charging station 300 includes an electricity meter 400 that measures electric power consumed by facilities of the charging station 300 and communicates with the server 500.

The vehicle 100 includes an electrical charging device (not shown), such as a battery, and a connector 110.

The charging device 200 allows a user to electrically connect the vehicle 100 with the charging station 300 to recharge the battery. The charging device 200 is connected to the connector 110 of the vehicle 100 and is also connected to a connector 310 of the charging station 300.

First, the charging device 200 communicates with the electricity meter 400 to initiate recharge. In response to the electricity meter 400, the charging device 200 performs charging of the battery. Upon completion of the charging, the charging device 200 requests that the electricity meter 400 send billing information to the charging device 200. The electricity meter 400 requests that the server 500 send billing information for the charging device 200 to the electricity meter 400.

Figure 2:
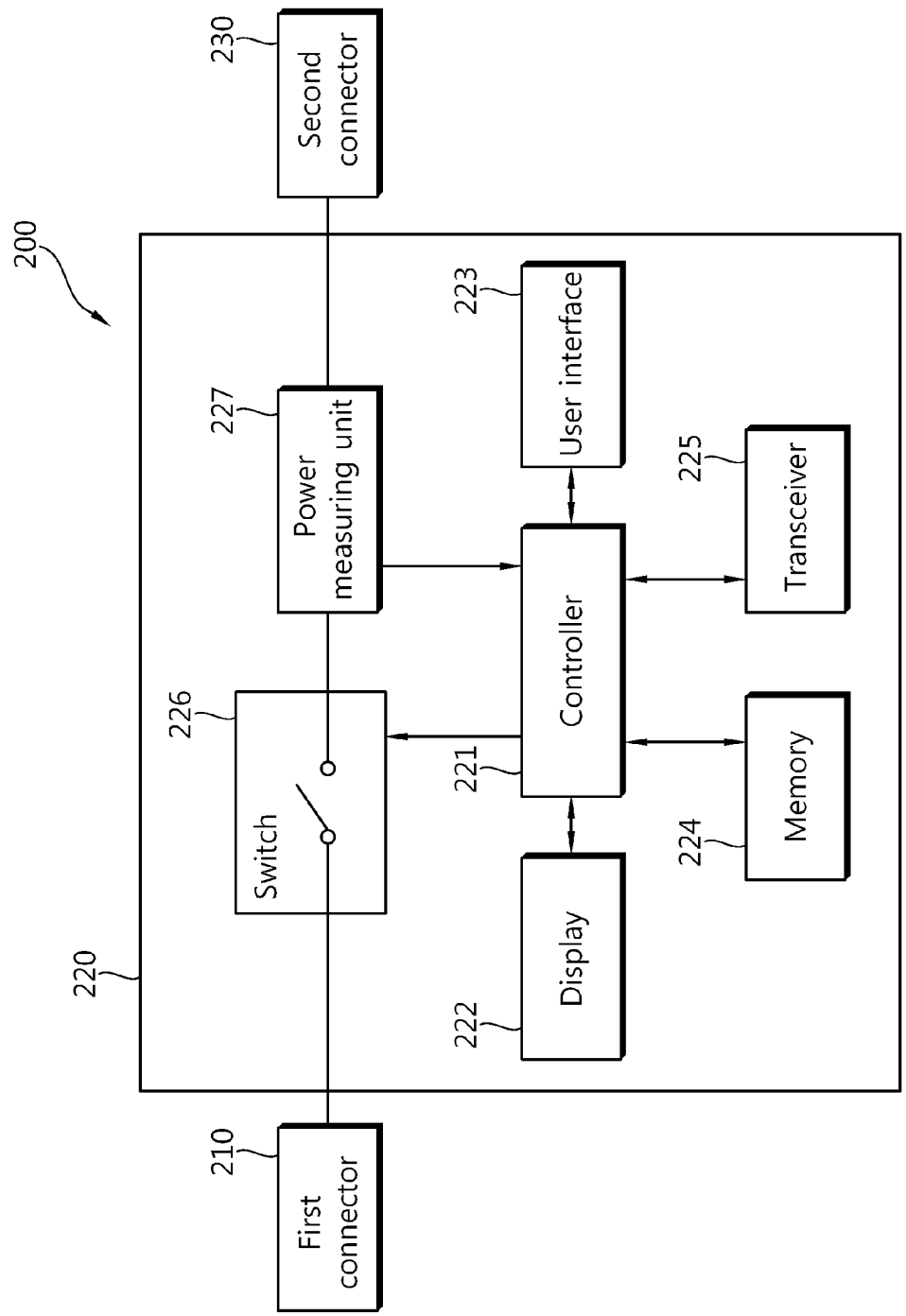
FIG. 2 is a block diagram illustrating the charging device shown in FIG. 1.

FIG. 2 is a block diagram illustrating the charging device shown in FIG. 1.

The charging device 200 includes a first connector 210, a control device 220, and a second connector 230.

The first connector 210 is electrically connected to the connector 110 of the vehicle 100. The second connector 230 is electrically connected to the connector 310 of the charging station 300.

The control device 220 controls operation of the charging device 200. More specifically, the control device 220 includes a controller 221, a display 222, a user interface 223, a memory 224, a transceiver 225, a switch 226, and a power measuring unit 227.

The display 222 displays authorization information, charging information, or billing information to a user. The display 222 includes a well-known display, such as an LCD (Liquid Crystal Display), or an OLED (Organic Light Emitting Diode) display. For example, the display 222 may display a remaining charging time or charging state while charging. Further, the display 222 may display billing information after completion of the charging.

The user interface 223 may include a combination of well-known user interfaces, such as a keypad or touch screen. The user interface 223 may be used for entry of a password for user authentication or for entry of user information, such as a charging identifier.

The memory 224 stores the charging identifier and/or authentication information. The authentication information is information for authenticating a user or vehicle to initiate charging of the battery. The charging identifier is an identifier used for identifying a user and/or vehicle 100 to perform charging. The charging identifier may include at least one of a user identifier and a vehicle identifier. The memory 224 may store payment information, such as a user's account or credit card information.

The transceiver 225 communicates with the electricity meter 400 through a power line communication network, a wireless LAN, or a mobile communication network.

The switch 226, in response to a command from the controller 221, connects or disconnects the first connector 210 to/from the second connector 230. When the first connector 210 is connected to the second connector 230, the charging station 300 is connected to the vehicle 100, so that charging is initiated. When the connection between the first connector 210 and the second connector 230 is released, the charging is stopped.

As the charging initiates, the power measuring unit 227 measures electric power used for charging of the battery.

The controller 221 performs user authentication and controls the charging device 200.

The controller 221 communicates various messages with the electricity meter 400 through the transceiver 225. The controller 221 may transmit a charging initiation request and a charging completion message to the electricity meter 400. The controller 221 may receive a charging initiation response and charging information from the electricity meter 400.

Upon initiation of charging, the controller 221 instructs the switch 226 to connect the first connector 210 with the second connector 230. When the charging is complete or stopped, the controller 221 instructs the switch 226 to disconnect the first connector 210 from the second connector 230.

Figure 3:
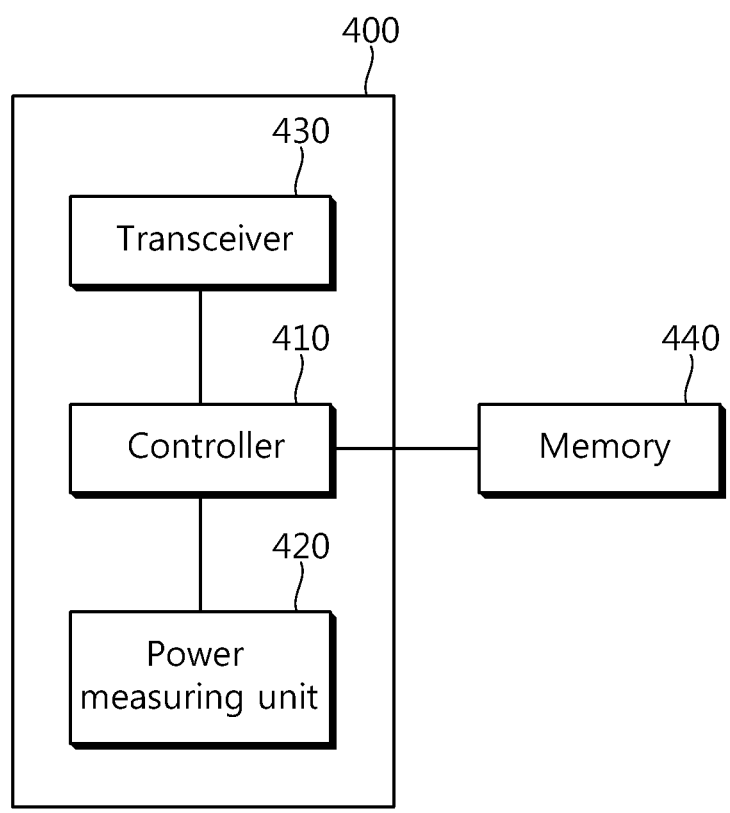
FIG. 3 is a block diagram illustrating the electricity meter shown in FIG. 1.

FIG. 3 is a block diagram illustrating the electricity meter shown in FIG. 1.

The electricity meter 400 includes a controller 410, a power measuring unit 420, a transceiver 430, and a memory 440.

The power measuring unit 420 measures electric power consumed by the charging station 300. The power measuring unit 420 is a facility basically installed in the charging station 300 irrespective of whether the charging device 200 consumes electric power and measures electric power consumed by facilities used in the charging station 300. Billing on electric power consumed by the charging station 300 is based on electric energy measured by the electricity meter 400. The electricity meter 400 may measure not only the power consumption but also other various information, such as the amount of gas or tab water consumed by the charging station 300.

The transceiver 430 communicates with the charging device 200 and the server 500 through a power line communication network, a wireless LAN, or a mobile communication network.

The memory 440 stores an identifier of the electricity meter 400 and/or an identifier of the charging station 300. Hereinafter, an identifier for identifying the electricity meter 400 and/or the charging station 300 is referred to as a meter identifier. The meter identifier includes at least one of an identifier of the electricity meter 400 and an identifier of the charging station 300.

The controller 410 controls operation of the electricity meter 400, and communicates various messages with the charging device 200 and the server 500 through the transceiver 430. The controller 410 receives a charging initiation request from the charging device 200 and transmits a charging initiation response to the charging device 200. When receiving a billing request from the charging device 200, the controller 410 forwards the billing request to the server 500 and receives billing information. The controller 410 may transmit the received billing information to the charging device 200.

Figure 4:
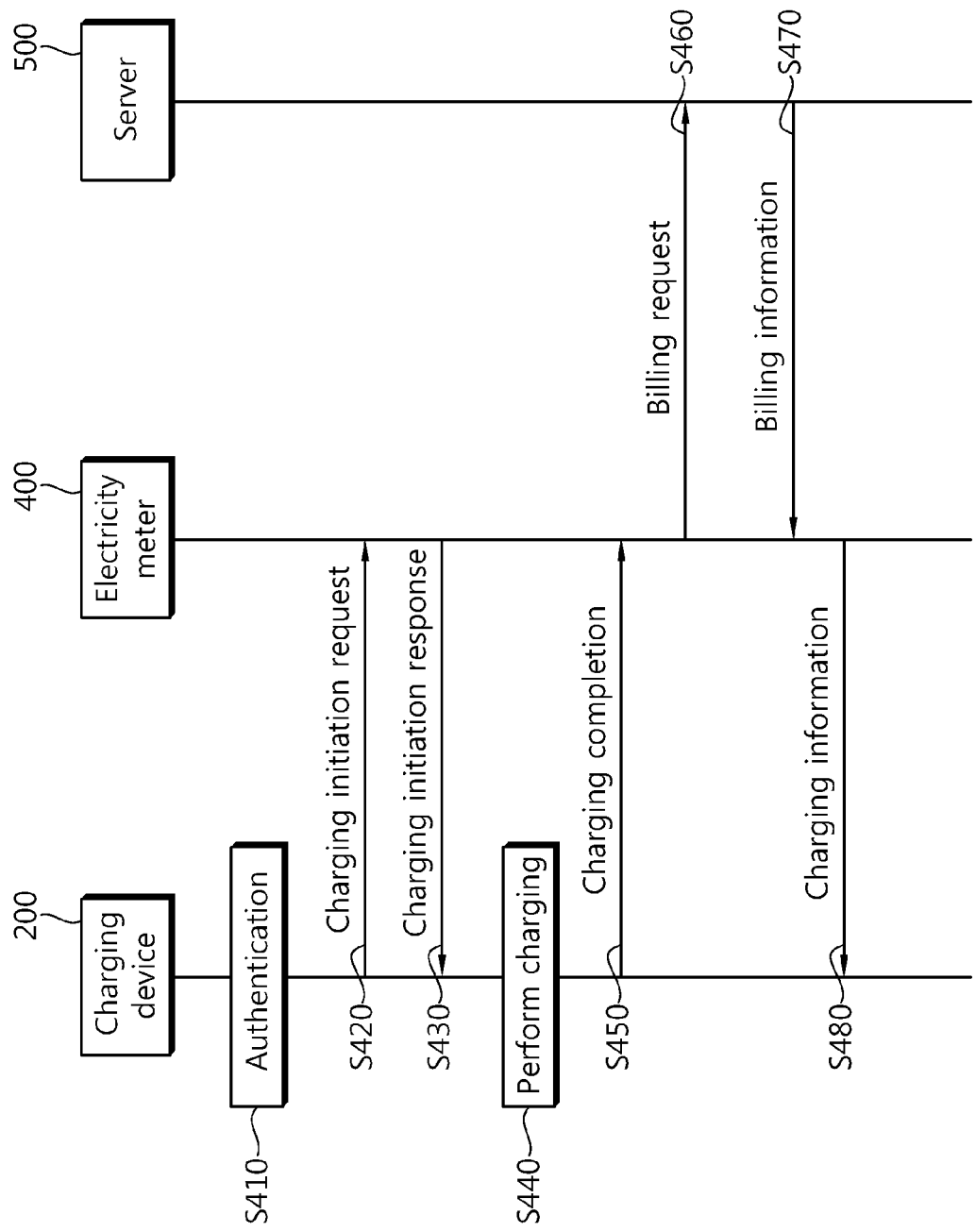
FIG. 4 is a flowchart illustrating a charging method according to an embodiment of the present invention.

FIG. 4 is a flowchart illustrating a charging method according to an embodiment of the present invention.

In step S410, the charging device 200 performs authentication of a user. The user authentication is performed by entry of a password or by other various methods.

When the user authentication is complete, the charging device 200 sends a charging initiation request to the electricity meter 400 in step S420. The charging initiation request includes a charging identifier. The electricity meter 400 may identify which user requests charging through the charging identifier.

In step S430, the charging device 200 receives a charging initiation response from the electricity meter 400 in response to the charging initiation request. The charging initiation response includes the charging identifier and a meter identifier. The charging device 200 may identify what electricity meter performs charging through the meter identifier.

After receiving the charging initiation response, the charging device 200, in step S440, connects the charging station to the battery and performs charging. While charging, the charging device 200 measures electric power for charging. Likewise, the electricity meter 400 also keeps measuring electric power consumed.

As the charging is complete, the charging device 200 forwards a charging completion message to the electricity meter 400 in step S450. The charging completion message includes electric power for charging, the charging identifier, and/or the meter identifier. The electricity meter 400 determines that charging is complete from the charging device 200 performing the battery charging based on the meter identifier of the electricity meter 400.

In step S460, the electricity meter 400 sends a billing request to the server 500. The billing request includes the electric power for charging, charging identifier, and/or meter identifier.

In step S470, the server 500 produces billing information according to the battery charging based on information included in the billing request and sends the produced billing information to the electricity meter 400.

The server 500 determines the user based on the charging identifier and identifiers the electricity meter 400 based on the meter identifier. The server 500 performs billing on the electric power consumed by the charging station 300 except for electric power consumed by the user. The server 500 bills the user for the electric power for charging.

In step S480, the electricity meter 400 sends charging information indicating the billing information to the charging device 200. The charging device 200 displays the billing information so that the user may recognize the billing information.

When the user connects the charging device 200 to the charging station 300 and succeeds in authentication, billing may be performed for charging through communication among the charging device 200, the electricity meter 400, and the server 500.

Accordingly, no separate authentication device or billing device is required at the charging station 300, and various points, such as houses or gas stations, for a user to be able to easily access may be utilized as charging stations by using the charging device 200.

The controller may be implemented by a processor. The processor may include application-specific integrated circuit (ASIC), other chipset, logic circuit and/or data processing device. The memory may include read-only memory (ROM), random access memory (RAM), flash memory, memory card, storage medium and/or other storage device. The RF unit may include baseband circuitry to process radio frequency signals. When the embodiments are implemented in software, the techniques described herein can be implemented with modules (e.g., procedures, functions, and so on) that perform the functions described herein. The modules can be stored in memory and executed by processor. The memory can be implemented within the processor or external to the processor in which case those can be communicatively coupled to the processor via various means as is known in the art.

In view of the exemplary systems described herein, methodologies that may be implemented in accordance with the disclosed subject matter have been described with reference to several flow diagrams. While for purposed of simplicity, the methodologies are shown and described as a series of steps or blocks, it is to be understood and appreciated that the claimed subject matter is not limited by the order of the steps or blocks, as some steps may occur in different orders or concurrently with other steps from what is depicted and described herein. Moreover, one skilled in the art would understand that the steps illustrated in the flow diagram are not exclusive and other steps may be included or one or more of the steps in the example flow diagram may be deleted without affecting the scope and spirit of the present disclosure.

The invention claimed is:

1. A method of charging a battery, comprising:
   releasably connecting a first connector of a charging device to a connector of the battery, the charging device allowing a user to electrically connect the battery with a charging station to recharge the battery;

releasably connecting a second connector of the charging device to a connector of a charging station, the charging station being connected to a power grid through a power line and receives power from the power grid, being connected to a server that generates billing information according to use of electric power, and including an electricity meter that measures electric power consumed by facilities of the charging station and communicates with the server;

performing, by the charging device, authentication for identifying the user of the battery;

transmitting, by the charging device, a charging initiation request to the electricity meter of the charging station for charging the battery upon completion of the authentication for identifying the user, the charging initiation request including a charging identifier for identifying the user;

receiving, by the charging device, a charging initiation response in response to the charging initiation request from the electricity meter, the charging initiation response including a meter identifier for identifying which electricity meter performs charging and the charging identifier;

performing, by the charging device corresponding to the charging identifier, charging by connecting the charging station with the battery and initiating charging after receiving the charging initiation response in response to the charging initiation request;

measuring, by the electricity meter, electric power provided to the charging station by the power grid;

transmitting, by the charging device, a charging completion message indicating electric power provided for charging to the electricity meter upon completion of the charging, the charging completion message including the charging identifier and the meter identifier; and receiving, by the charging device, charging information indicating billing information according to the charging of the battery from the electricity meter based on an amount of electric power consumed by the charging station and the amount of electric power consumed by the charging device, wherein the charging information includes the charging identifier and the meter identifier.

2. A charging device for charging a battery, comprising:

a first connector releasably electrically connected to a connector of the battery, the charging device allowing a user to electrically connect the battery with a charging station to recharge the battery;

a second connector releasably electrically connected to a connector of a charging station, the charging station being connected to a power grid through a power line and receives power from the power grid, being connected to a server that generates billing information according to use of electric power, and including an electricity meter that measures electric power consumed by facilities of the charging station and communicates with the server; and a control device connected to the first and second connectors and configured to:

perform authentication for identifying the user;

transmit a charging initiation request to the electricity meter of the charging station to which electric power is supplied for charging the battery upon completion of the authentication for identifying the user, the charging initiation request including a charging identifier for identifying the user;

receive a charging initiation response in response to the charging initiation request from the electricity meter, the charging initiation response including a meter identifier for identifying which electricity meter performs charging and the charging identifier;

allow the charging device corresponding to the charging identifier of the charging initiation response to perform charging by connecting the second connector connected to the connector of the charging station and the first connector connected to the connector of the battery and initiating charging after receiving the charging initiation response in response to the charging initiation request;

measuring an amount of electric power consumed by the charging device for charging the battery;

transmit a charging completion message to the electricity meter upon completion of the charging, the charging completion message including the amount of the electric power consumed by the charging device, the charging identifier, and the meter identifier; and receive charging information indicating billing information according to the charging of the battery from the electricity meter, based on an amount of electric power consumed by the charging station and the amount of electric power consumed by the charging device, wherein the charging information includes the charging identifier and the meter identifier.

3. The charging device of claim 2, wherein the control device comprises:

a display for displaying the billing information, a power measuring unit for measuring electric power consumed for charging the battery, a memory for storing the charging identifier, a transceiver for communicating with the electricity meter, and a controller connected to the transceiver.

4. The charging device of claim 2, wherein the control device further includes a switch for initiating charging by connecting the first and second connectors to each other and stopping charging by disconnecting the first connector from the second connector in response to a command from the controller.

5. The charging device of claim 2, wherein the control device comprises a switch for initiating charging by connecting the first connector and the second connector to each other and stopping charging by disconnecting the first connector from the second connector.

6. The method of charging a battery of claim 1, further comprising:

transmitting a billing request from the electricity meter to the server; and receiving, by the electricity meter, billing information from the server.

7. The charging device of claim 2, wherein the control device is further configured to transmit a billing request from the electricity meter to the server; and wherein the electricity meter is configured to receive billing information from the server.

* * * * *